(12) United States Patent
Miyake

(10) Patent No.: US 11,145,764 B2
(45) Date of Patent: Oct. 12, 2021

(54) DISPLAY DEVICE

(71) Applicant: Japan Display Inc., Minato-ku (JP)

(72) Inventor: Hidekazu Miyake, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 125 days.

(21) Appl. No.: 16/532,791

(22) Filed: Aug. 6, 2019

(65) Prior Publication Data

US 2020/0052129 A1 Feb. 13, 2020

(30) Foreign Application Priority Data

Aug. 9, 2018 (JP) .............................. JP2018-150623

(51) Int. Cl.

| | | |
|---|---|---|
| H01L 29/786 | (2006.01) | |
| H01L 51/52 | (2006.01) | |
| H01L 29/417 | (2006.01) | |
| H01L 27/12 | (2006.01) | |
| H01L 27/32 | (2006.01) | |
| G02F 1/1368 | (2006.01) | |
| G02F 1/1362 | (2006.01) | |

(52) U.S. Cl.
CPC ...... *H01L 29/78648* (2013.01); *H01L 27/124* (2013.01); *H01L 27/1225* (2013.01); *H01L 29/4175* (2013.01); *H01L 29/41733* (2013.01); *H01L 29/7869* (2013.01); *G02F 1/1368* (2013.01); *G02F 1/136286* (2013.01); *H01L 27/3262* (2013.01); *H01L 27/3276* (2013.01)

(58) Field of Classification Search
CPC ............. G02F 1/1368; G02F 1/136209; G02F 1/136286; H01L 27/1225; H01L 27/124; H01L 27/3248; H01L 27/3262; H01L 27/3272; H01L 27/3276; H01L 29/786–29/78696
See application file for complete search history.

(56) References Cited

U.S. PATENT DOCUMENTS

| | | | |
|---|---|---|---|
| 2015/0380560 A1* | 12/2015 | Ishikawa ............. | H01L 29/7869 257/43 |
| 2017/0062542 A1* | 3/2017 | Jung ................... | H01L 51/5203 |
| 2018/0151654 A1* | 5/2018 | Lee ...................... | H01L 27/3272 |
| 2018/0158844 A1* | 6/2018 | Choi ................... | H01L 27/1225 |
| 2019/0006521 A1* | 1/2019 | Noh .................. | H01L 29/41733 |
| 2019/0148558 A1* | 5/2019 | Suzuki ................ | H01L 29/7869 257/43 |

FOREIGN PATENT DOCUMENTS

JP 2014-135378 A 7/2014

\* cited by examiner

*Primary Examiner* — Eric A. Ward
(74) *Attorney, Agent, or Firm* — Oblon, McClelland, Maier & Neustadt, L.L.P.

(57) ABSTRACT

A display device includes a pixel layer for displaying an image and a circuit layer including a thin film transistor for driving the pixel layer. The thin film transistor includes a semiconductor layer including a channel region and a source region and a drain region sandwiching the channel region, a first gate electrode facing the channel region on a first side which is either above or below the semiconductor layer, a second gate electrode facing at least the channel region and the source region on a second side opposite to the first side, a source electrode connected to the source region, and a drain electrode connected to the drain region. The source electrode penetrates through the semiconductor layer and is connected to the second gate electrode on the second side.

13 Claims, 23 Drawing Sheets

$D_{dg} = D_{sg}$
$D_{ce1} < D_{dg}$
$D_{sg} < D_{ce2}$

DISPLAY DEVICE

CROSS-REFERENCE TO RELATED APPLICATION

The present application claims priority from Japanese patent application JP2018-150623 filed on Aug. 9, 2018, the content of which is hereby incorporated by reference into this application.

BACKGROUND OF THE INVENTION

1. Field of the Invention

The present invention relates to a display device.

2. Description of the Related Art

In recent years, high definition of a display has been accelerated. With the high definition of the display, an area per pixel is reduced, which makes it difficult to dispose a thin film transistor or a wiring. In an organic electroluminescent display, many thin film transistors are disposed in the pixel, and thus improvement is urgently needed. It is known to dispose a metal layer below the thin film transistor (JP 2014-135378 A). The metal layer prevents a semiconductor layer from being irradiated with backlight in a liquid crystal display.

In the related art, the metal layer is often floating and is affected by variation in potential of an underlying layer. In order to stabilize potential of the metal layer and improve display unevenness, it is necessary to connect the metal layer to a predetermined potential, but there is no room for forming a contact portion for connection in a display area.

SUMMARY OF THE INVENTION

An object of the present invention is to form a second gate electrode connected to a predetermined potential above or below a thin film transistor.

A display device according to the present invention includes a pixel layer for displaying an image, a circuit layer including a thin film transistor for driving the pixel layer. The thin film transistor includes a semiconductor layer including a channel region and a source region and a drain region sandwiching the channel region, a first gate electrode facing the channel region on a first side which is either above or below the semiconductor layer, a second gate electrode facing at least the channel region and the source region on a second side opposite to the first side, a source electrode connected to the source region, and a drain electrode connected to the drain region. The source electrode penetrates through the semiconductor layer and is connected to the second gate electrode on the second side.

According to the present invention, the source electrode is connected to the second gate electrode on the second side and both the source electrode and the second gate electrode are at the same potential. This electrical connection is made by the source electrode penetrating through the semiconductor layer, and thus there is no need to secure a region for connection.

DETAILED DESCRIPTION OF THE INVENTION

Figure 1:
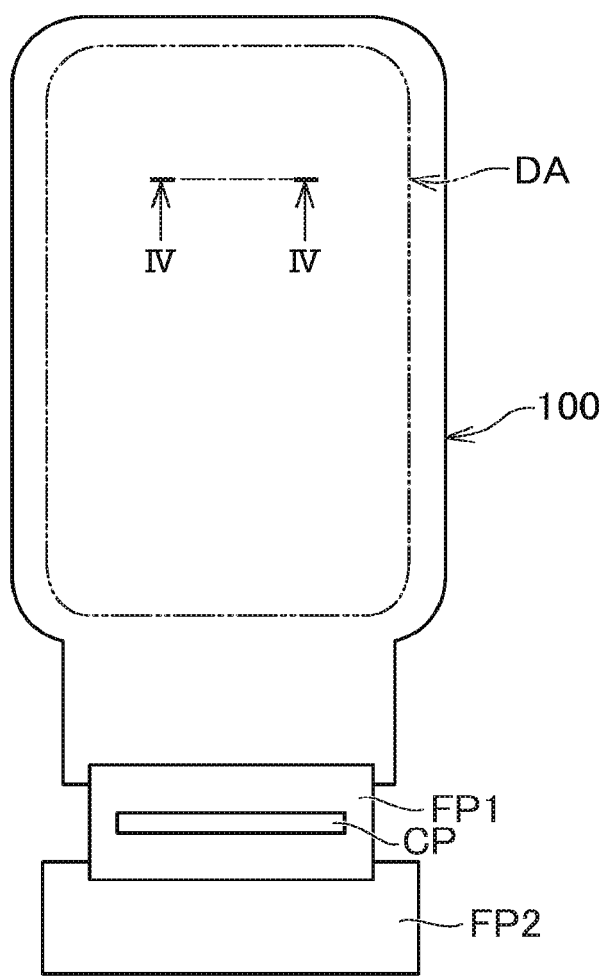
FIG. 1 is a plan view of a display device according to a first embodiment of the present invention.

Hereinafter, embodiments of the present invention will be described with reference to the drawings. However, the present invention can be embodied in various modes without departing from the gist of the present invention, and the present invention is not interpreted as being limited to the description contents of the embodiments exemplified below. Although the drawings may be schematically represented with respect to the width, thickness, shape, and the like of each part in comparison with an actual aspect in order to clarify the explanation, the drawings are merely an example, and do not limit the interpretation of the present invention. In the present specification and the drawings, elements having the same functions as those described with reference to the drawings already illustrated may be denoted by the same reference numerals and redundant description may be omitted.

Furthermore, in the detailed description of the present invention, when specifying a positional relationship between a certain component and another component, the terms "above", "on" and "below" include the case where another component is positioned immediately above or immediately below a certain component, unless otherwise specified, the case where another component is further interposed is included.

First Embodiment

Figure 2:
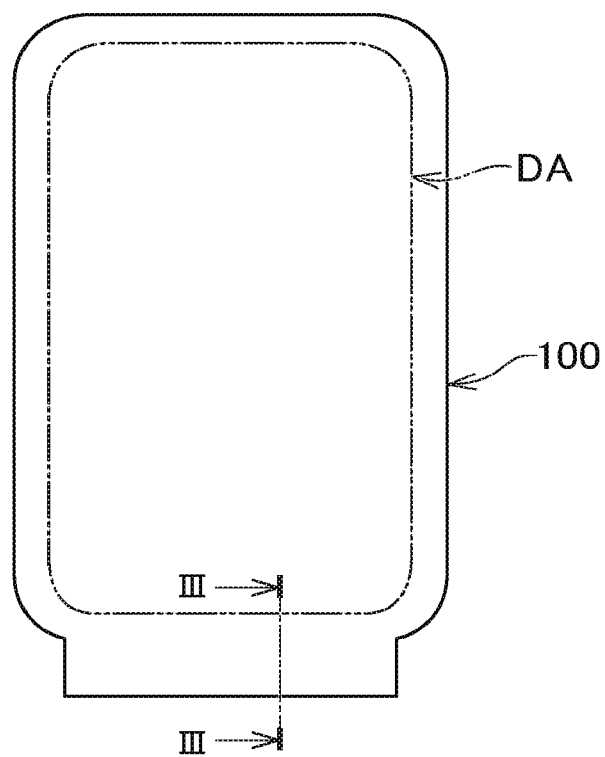
FIG. 2 is a schematic view illustrating a use state of the display device.
Figure 3:
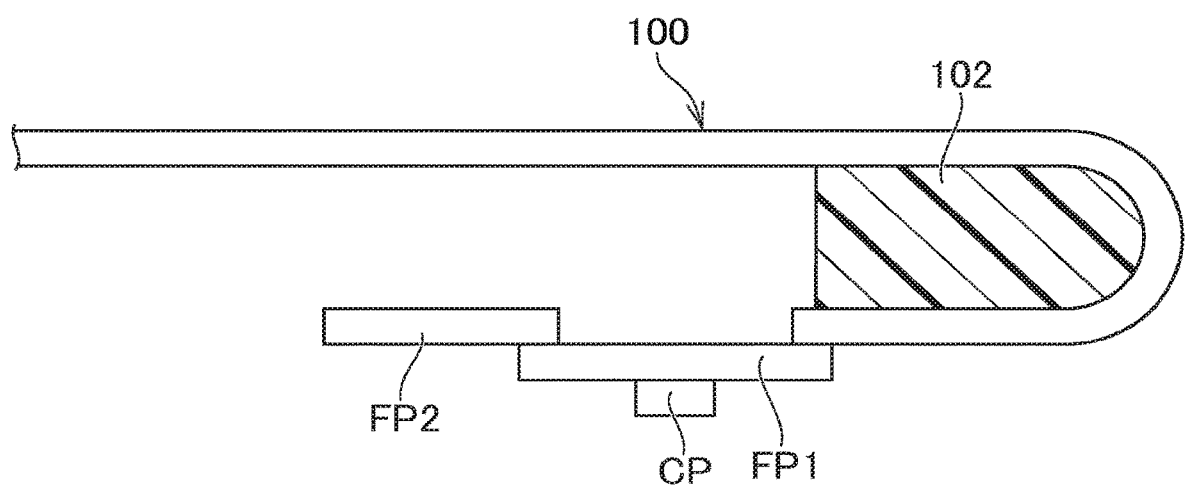
FIG. 3 is a schematic view of a cross section of the display device illustrated in FIG. 2, taken along line III-III.

FIG. 1 is a plan view of a display device according to a first embodiment of the present invention. The display device is actually bent and used. Accordingly, FIG. 1 is a developed view before bending the display device. FIG. 2 is a schematic view illustrating a use state of the display device. FIG. 3 is a schematic view of a cross section of the display device illustrated in FIG. 2, taken along line III-III. The display device includes a display 100. A spacer 102 is disposed inside a bend to prevent the display 100 from bending too much. The display 100 has flexibility and is bent outside a display area DA. A first flexible printed circuit board FP1 is connected to the display 100 outside the display area DA. An integrated circuit chip CP for driving an element for displaying an image is mounted on the first flexible printed circuit board FP1. Furthermore, a second flexible printed circuit board FP2 is connected to the first flexible printed circuit board FP1.

The display device is, for example, an organic electroluminescent display device. The display device has the display area DA in which an image is displayed. In the display area DA, for example, unit pixels (sub-pixels) of plural colors of red, green and blue are combined to form a full-color pixel, and a full-color image is displayed.

Figure 4:
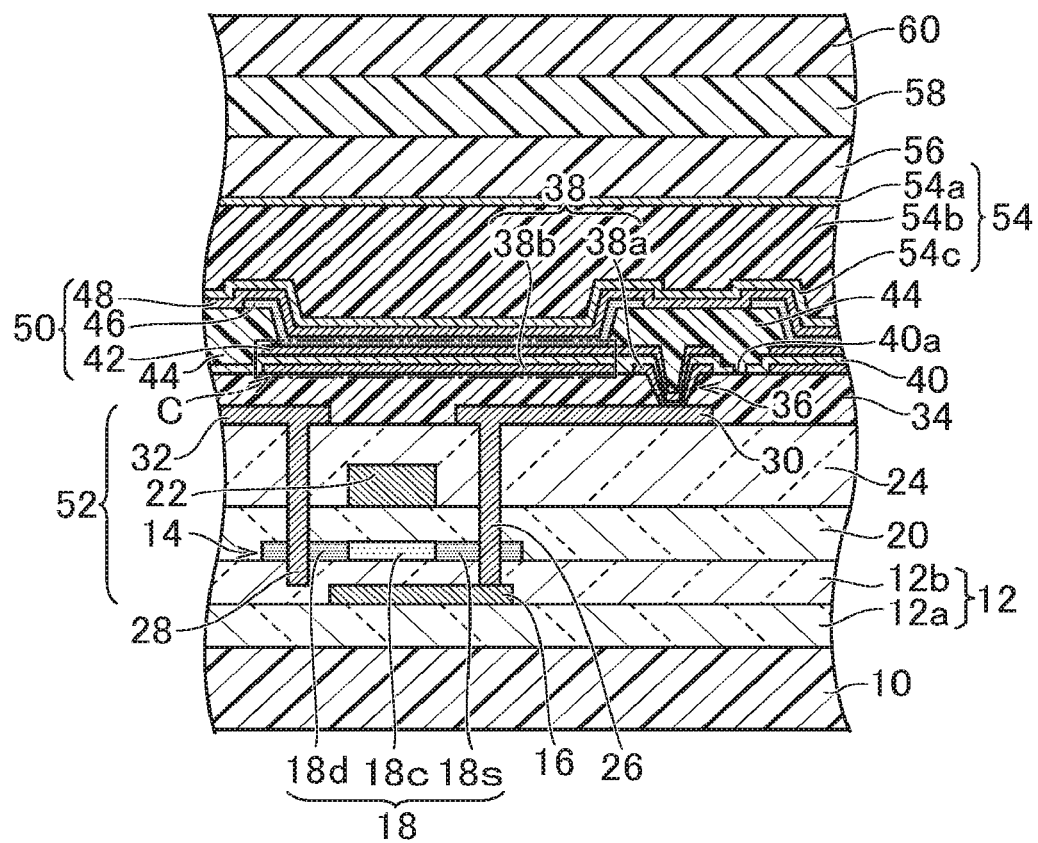
FIG. 4 is a cross-sectional view of the display device illustrated in FIG. 1, taken along line IV-IV.

FIG. 4 is a cross-sectional view of the display device illustrated in FIG. 1, taken along line IV-IV. A substrate 10 is made of polyimide. Other resin materials may be used as long as the substrate is flexible enough to configure a sheet display or a flexible display, and a glass substrate may be used if it is not necessary to bend.

An undercoat layer 12 is laminated on the substrate 10. The undercoat layer 12 is made of an insulating material such as SiO, SiN, AlO$_x$, and the like, and includes a first layer 12a for improving adhesion to the substrate 10, and a second layer 12b for blocking water or impurities or blocks of hydrogen atoms contained in the first layer 12a, but is not particularly limited to this structure, and may be further laminated or may be a single layer.

A thin film transistor 14 is formed on the undercoat layer 12. The thin film transistor 14 includes a second gate electrode 16. The second gate electrode 16 is made of metal (high melting point material) such as Mo, Ta, W or the like, and has a thickness of about 10 to 100 nm. The second gate electrode 16 suppresses change in the characteristics of the thin film transistor 14 due to infiltration of light from a back surface of a channel region 18c and the like, and gives a back gate effect to the thin film transistor 14 by being given a predetermined potential. Here, after a first layer 12a is formed, the second gate electrode 16 is formed in an island shape, and then, a second layer 12b is laminated, thereby forming the second gate electrode 16 so as to be enclosed in the undercoat layer 12, but is not limited thereto. The second gate electrode 16 may be formed first on the substrate 10, and then the undercoat layer 12 may be formed.

The thin film transistor 14 includes a semiconductor layer 18. The semiconductor layer 18 includes the channel region 18c, a source region 18s, and a drain region 18d. The source region 18s and the drain region 18d sandwich the channel region 18c. Although only Nch transistors are illustrated here by taking polysilicon thin film transistors as an example, Pch transistors may be formed simultaneously. The semiconductor layer 18 may be made of an oxide semiconductor or an organic semiconductor. A gate insulating film 20 is made of SiO, SiN, AlOx, or a laminated film of these.

The thin film transistor 14 includes a first gate electrode 22. The first gate electrode 22 faces the channel region 18c on either an upper side or lower side (in this example, upper side) of the semiconductor layer 18. In other words, a region facing the first gate electrode 22 is the channel region 18c. The first gate electrode 22 is preferably made of a metal such as Mo, Ta or W, but is not limited thereto. An interlayer insulating film 24 (for example, SiO, SiN, AlOx, or a laminated film thereof) is laminated on the first gate electrode 22.

The thin film transistor 14 includes a source electrode 26 connected to the source region 18s and a drain electrode 28 connected to the drain region 18d. The source electrode 26 and the drain electrode 28 are preferably made of a low resistance metal such as Al or Cu, but may be formed of a lamination of a metal such as Ti or W, or an alloy thereof.

The source electrode 26 penetrates through the semiconductor layer 18 (source region 18s). The drain electrode 28 penetrates through the semiconductor layer 18 (drain region 18d). The source electrode 26 and the drain electrode 28 penetrate through the interlayer insulating film 24. A source wiring 30 connected to the source electrode 26 and a drain wiring 32 connected to the drain electrode 28 are formed above the semiconductor layer 18 (on the interlayer insulating film 24).

In this embodiment, the second gate electrode 16 faces at least the channel region 18c and the source region 18s on either the upper or lower side (in this example, the lower side) of the semiconductor layer 18. The source electrode 26 is connected to the second gate electrode 16 below the semiconductor layer 18 and both electrodes 16 and 26 are at the same potential. This electrical connection is made by the source electrode 26 penetrating through the semiconductor layer 18 (source region 18s), and thus there is no need to secure a region for connection. The drain electrode 28 penetrates through the semiconductor layer 18 (drain region 18d) but extends below the semiconductor layer 18 so as not to contact the second gate electrode 16.

Figure 5:
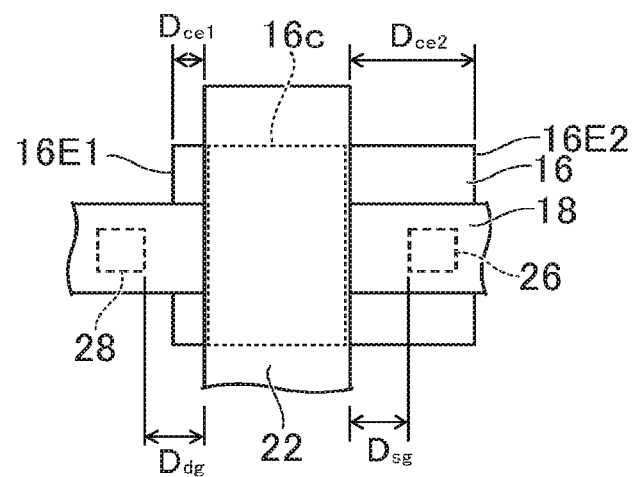
FIG. 5 is a plan view of a thin film transistor in the first embodiment.

FIG. 5 is a plan view of the thin film transistor 14 in the first embodiment. The source electrode 26 and the drain electrode 28 are equally spaced apart from the first gate electrode 22. That is, a distance Dsg between the source electrode 26 and the first gate electrode 22 is equal to a distance Ddg between the drain electrode 28 and the first gate electrode 22. The second gate electrode 16 has a central region 16c facing the first gate electrode 22. The second gate electrode 16 has a first end 16E1 that is closer to the drain electrode 28. A distance Dce1 from the central region 16c to the first end 16E1 is smaller than the distance Ddg from the first gate electrode 22 to the drain electrode 28. The second gate electrode 16 has a second end 16E2 that is closer to the source electrode 26. A distance Dce2 from the central region 16c to the second end 16E2 is larger than the distance Dsg from the first gate electrode 22 to the source electrode 26.

As illustrated in FIG. 4, an organic flattening film 34 is provided so as to cover the source electrode 26 and the drain electrode 28 and the source wiring 30 and the drain wiring 32. Since the organic flattening film 34 is superior in surface flatness to an inorganic insulating material formed by chemical vapor deposition (CVD) or the like, resin such as photosensitive acrylic is used.

The organic flattening film 34 is removed at a pixel contact portion 36, and an indium tin oxide (ITO) film 38 is formed thereon. The indium tin oxide film 38 includes a first transparent conductive film 38a and a second transparent conductive film 38b separated from each other.

The source wiring 30 whose surface is exposed by removing the organic flattening film 34 is covered with the first transparent conductive film 38a. A silicon nitride film 40 is provided on the organic flattening film 34 so as to cover the first transparent conductive film 38a. The silicon nitride film 40 has an opening in the pixel contact portion 36, and a pixel electrode 42 is laminated on the silicon nitride film 40 so as to be conductive to the source wiring 30 through the opening. The pixel electrode 42 is formed as a reflective electrode, and has a three-layer laminated structure of an indium zinc oxide film, an Ag film, and an indium zinc oxide film. Here, an indium tin oxide film may be used instead of the indium zinc oxide film. The pixel electrode 42 extends laterally from the pixel contact portion 36 and reaches above the thin film transistor 14.

The second transparent conductive film 38b is provided adjacent to the pixel contact portion 36 and below the pixel electrode 42 (and further below the silicon nitride film 40). The second transparent conductive film 38b, the silicon nitride film 40 and the pixel electrode 42 overlap, and a capacitor C is formed by the films and the electrode.

On the organic flattening film 34, for example, above the pixel contact portion 36, an organic insulating film 44, which is called a bank (rib) and serves as a partition between adjacent pixel regions, is formed. As the organic insulating film 44, photosensitive acrylic or the like is used as in the case of the organic flattening film 34. The organic insulating film 44 is preferably opened so as to expose the surface of the pixel electrode 42 as a light emitting region, and an open end thereof preferably has a gentle tapered shape. If the open end has a sharp shape, coverage failure of an organic electroluminescent layer 46 formed thereon is caused.

The organic flattening film 34 and the organic insulating film 44 are in contact with each other through an opening 40a provided in the silicon nitride film 40 located therebetween. With this configuration, moisture and gas desorbed from the organic flattening film 34 can be withdrawn through the organic insulating film 44, through heat treatment and the like after formation of the organic insulating film 44.

An organic electroluminescent layer 46 made of an organic material is laminated on the pixel electrode 42. The organic electroluminescent layer 46 may be a single layer, but may have a structure in which a hole transport layer, a light emitting layer, and an electron transport layer are laminated in order from the pixel electrode 42. These layers may be formed by vapor deposition, may be formed by coating on solvent dispersion, may be formed selectively with respect to the pixel electrode 42, and may be formed solidly on the entire surface covering the display area DA. In the case of solid formation, white light is obtained in all sub-pixels, and a desired color wavelength portion is extracted by a color filter (not illustrated).

A counter electrode 48 is provided on the organic electroluminescent layer 46. Here, since a top emission structure is adopted, the counter electrode 48 is transparent. For example, an Mg layer and an Ag layer are formed as thin films that allows light emitted from the organic electroluminescent layer 46 to be transmitted through. According to the formation order of the organic electroluminescent layer 46 described above, the pixel electrode 42 becomes an anode and the counter electrode 48 becomes a cathode. A pixel layer 50 is configured by a plurality of the pixel electrodes 42, the counter electrode 48, and the organic electroluminescent layer 46 interposed between the central portion of each of the plurality of pixel electrodes 42 and the counter electrode 48. An image is displayed in the pixel layer 50. The pixel layer 50 is driven by a circuit layer 52 including the thin film transistor 14.

A sealing layer 54 is formed on the counter electrode 48. The sealing layer 54 has a function of preventing moisture infiltration from the outside to the organic electroluminescent layer 46 formed previously and is required to have a high gas barrier property. The sealing layer 54 has a laminated structure of an organic sealing layer 54b and a pair of inorganic sealing layers 54a and 54c (for example, silicon nitride layers 40) sandwiching the organic sealing layer 54b from above and below. The pair of inorganic sealing layers 54a and 54c contact and overlap around the organic sealing layer 54b. A silicon oxide layer or an amorphous silicon layer may be provided between each the pair of inorganic sealing layers 54a and 54c and the organic sealing layer 54b for the purpose of improving adhesion. A reinforcing organic film 56 is laminated on the sealing layer 54. A polarizing plate 60 is attached to the reinforcing organic film 56 via an adhesive layer 58. The polarizing plate 60 is, for example, a circularly polarizing plate.

Figure 6:
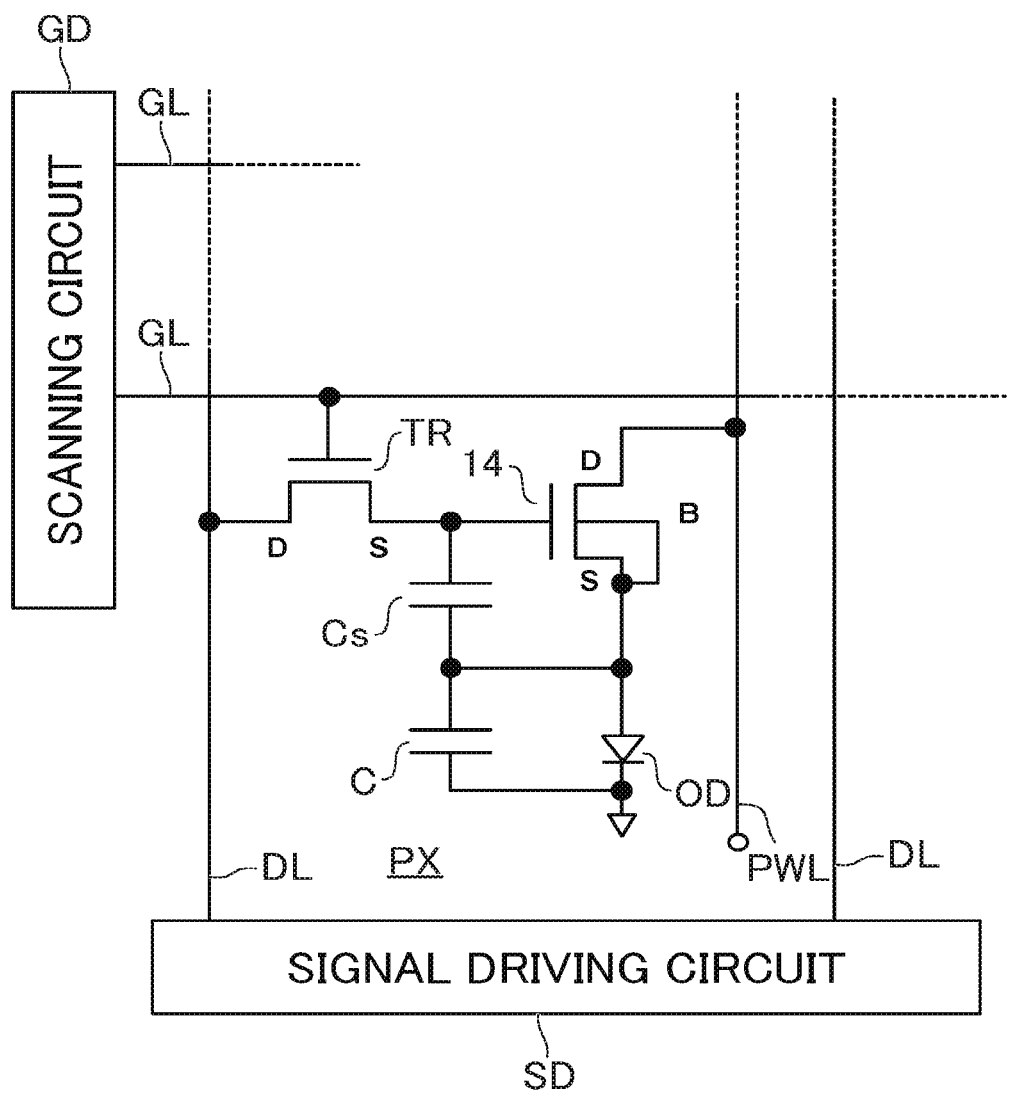
FIG. 6 is a circuit diagram of the display device illustrated in FIG. 1.

FIG. 6 is a circuit diagram of the display device illustrated in FIG. 1. The circuit has a plurality of scan lines GL connected to a scanning circuit GD and a plurality of signal lines DL connected to a signal driving circuit SD. The signal driving circuit SD is disposed in the integrated circuit chip CP illustrated in FIG. 1. An area surrounded by two adjacent scan lines GL and two adjacent signal lines DL is one pixel PX. The pixel PX includes the thin film transistor 14 as a drive transistor, a thin film transistor TR as a switch, a capacitor C, and a storage capacitor Cs. When a gate voltage is applied to the scan line GL, the thin film transistor 14 is turned ON, a video signal is supplied from the signal line DL and electric charge is accumulated in the storage capacitor CS and the capacitor C. By storing the electric charge in the storage capacitor CS, the thin film transistor 14 is turned ON, and a current flows from a power supply line PWL to a light emitting element OD. The light emitting element OD emits light by this current.

Modification Example 1

Figure 7:
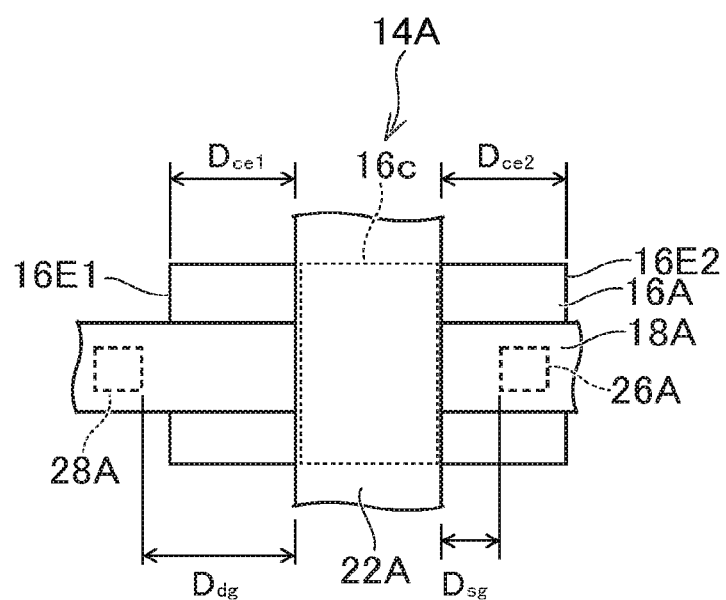
FIG. 7 is a plan view of a thin film transistor in Modification example 1 of the first embodiment.

FIG. 7 is a plan view of a thin film transistor 14A in Modification example 1 of the first embodiment. A drain electrode 28A is farther apart from a first gate electrode 22A than a source electrode 26A. That is, the distance Ddg between the drain electrode 28A and the first gate electrode 22A is larger than the distance Dsg between the source electrode 26A and the first gate electrode 22A. In a second gate electrode 16A, the first end 16E1 (side of the drain electrode 28A) and the second end 16E2 (side of the source electrode 26A) are equally spaced apart from the central region 16c. The distance Dce1 from the central region 16c to the first end 16E1 is smaller than the distance Ddg from the first gate electrode 22A to the drain electrode 28A. The other contents correspond to the contents described in the first embodiment. For example, the distance Dce2 from the central region 16c to the second end 16E2 is larger than the distance Dsg from the first gate electrode 22A to the source electrode 26A. Also, the source electrode 26A is connected to the second gate electrode 16A below a semiconductor layer 18A, and both the electrodes are at the same potential. This electrical connection is made by the source electrode 26A penetrating through the semiconductor layer 18A, and thus there is no need to secure a region for connection.

Modification Example 2

Figure 8:
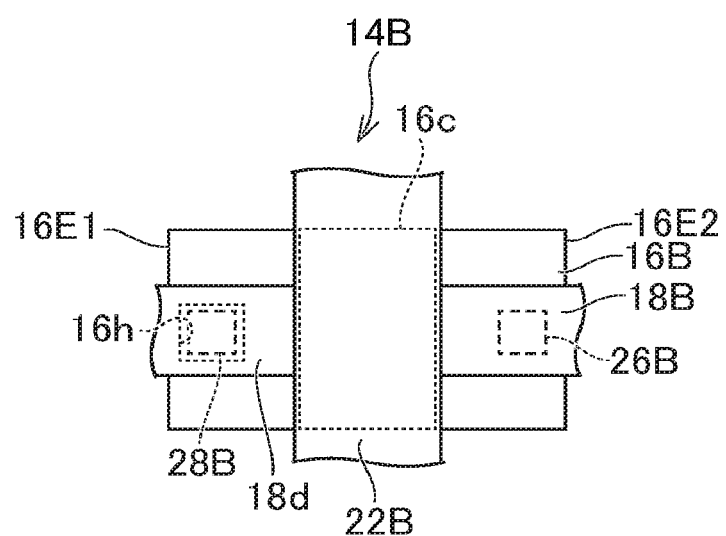
FIG. 8 is a plan view of a thin film transistor in Modification example 2 of the first embodiment.

FIG. 8 is a plan view of a thin film transistor 14B in Modification Example 2 of the first embodiment. In a second gate electrode 16B, the first end 16E1 (side of a drain electrode 28B) and the second end 16E2 (side of a source electrode 26B) are equally spaced apart from the central region 16c. The source electrode 26B and the drain electrode 28B are equally spaced apart from a first gate electrode 22B. The second gate electrode 16B has a hole 16h opposite to a drain region 18d. The drain electrode 28B extends at an interval to the inside of the hole 16h of the second gate electrode 16B so that the drain electrode 28B is not in contact with the second gate electrode 16B. The other contents correspond to the contents described in the first embodiment.

Modification Example 3

Figure 9:
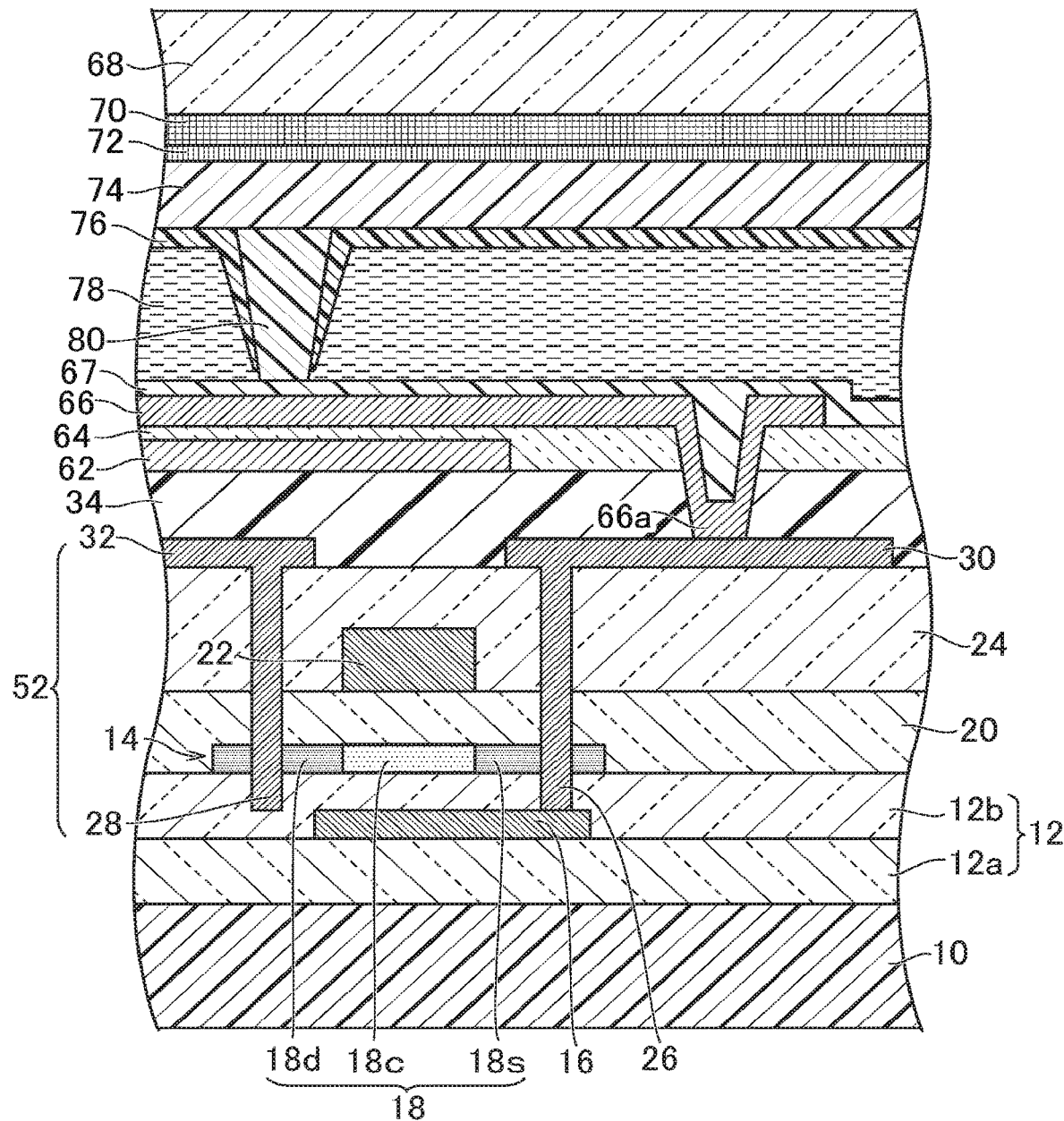
FIG. 9 is a cross-sectional view illustrating Modification example 3 of the first embodiment.

FIG. 9 is a cross-sectional view illustrating Modification example 3 of the first embodiment. The display device is a liquid crystal display device. A structure of the organic flattening film 34 and layers (including the thin film transistor 14) lower than the organic flattening film 34 is the same as the contents illustrated in FIG. 4.

Figure 10:
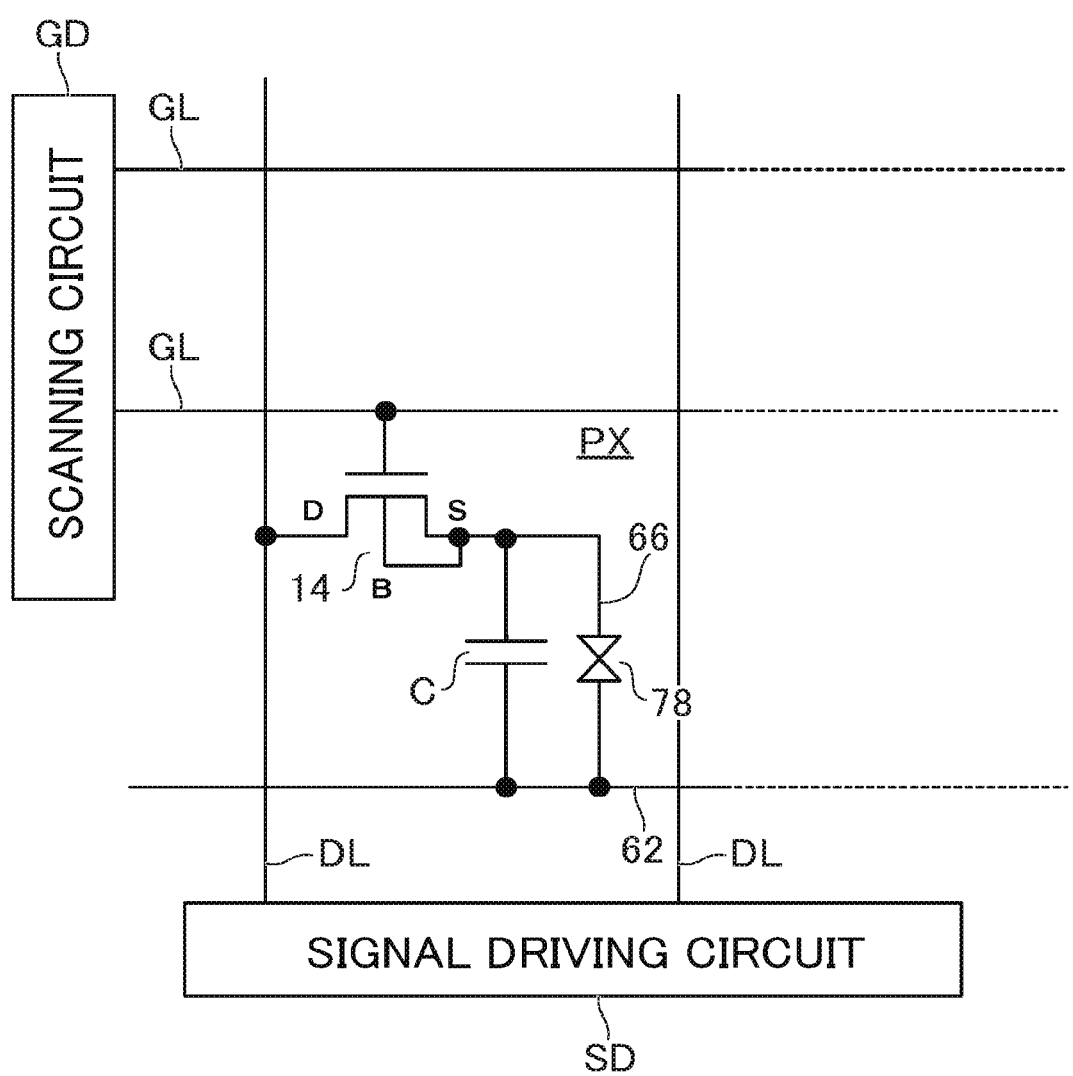
FIG. 10 is a circuit diagram of the display device illustrated in FIG. 9.

A common electrode 62 is disposed to be laminated on the organic flattening film 34. The common electrode 62 is formed across a plurality of pixels PX (FIG. 10). An insulating film 64 is laminated on the organic flattening film 34 so as to cover the common electrode 62. A plurality of pixel electrodes 66 are laminated on the insulating film 64. The pixel electrode 66 includes a contact portion 66a penetrating through the insulating film 64 and connected to the source wiring 30. A first alignment film 67 is laminated so as to cover the plurality of pixel electrodes 66. In the illustrated example, the pixel electrode 66 is formed above the common electrode 62 and is formed to have a plurality of slits. The pixel electrode 66 may be formed below the common electrode 62. In this case, the pixel electrode 66 is formed in a planar shape for each pixel PX illustrated in FIG. 10, and the common electrode 62 is formed across the plurality of pixels PX and is formed to have a plurality of slits at a position facing the pixel electrode 66. In the illustrated example, a horizontal electric field drive system in which the common electrode 62 and the pixel electrode 66 are positioned on a side of one substrate 10 of the liquid crystal display device is adopted, but a vertical electric field drive system may be adopted.

The liquid crystal display device includes a counter substrate 68. The counter substrate 68 is provided with a black matrix 70 and a color filter layer 72, which are covered with an overcoat layer 74 on the lower side. A second alignment film 76 is laminated to cover the overcoat layer 74. In the illustrated example, although the black matrix 70 is disposed between the counter substrate 68 and the color filter layer 72, the black matrix 70 may be disposed between the color filter layer 72 and the overcoat layer 74, or may be disposed between the overcoat layer 74 and the second alignment film 76.

Liquid crystal 78 is interposed between the first alignment film 67 and the second alignment film 76. A cell gap is held by a plurality of spacers 80. The plurality of spacers 80 are positioned between the first alignment film 67 and the overcoat layer 74. In the illustrated example, the spacer 80 is provided on the overcoat layer 74, and the second alignment film 76 is formed to cover the overcoat layer 74 and the spacer 80. The first alignment film 67 and the spacer 102 may be in contact with each other, or the second alignment film 76 may be interposed therebetween.

FIG. 10 is a circuit diagram of the display device illustrated in FIG. 9. The pixel PX includes the thin film transistor 14 disposed in the vicinity of a position where the scan line GL and the signal line DL intersect. The plurality of scan lines GL are connected to the scanning circuit GD, and the plurality of signal lines DL are connected to the signal driving circuit SD. The thin film transistor 14 is electrically connected to the scan line GL, the signal line DL, and the pixel electrode 66. By applying a gate voltage to the scan line GL, the thin film transistor 14 is turned ON and a video signal is supplied from the signal line DL to the pixel electrode 66. The pixel electrode 66 faces the common electrode 62, and drives the liquid crystal 78 by an electric field generated between the pixel electrode 66 and the common electrode 62. The capacitor C for holding a voltage applied to the liquid crystal 78 is connected to the common electrode 62 and the pixel electrode 66 in parallel with the liquid crystal 78.

Second Embodiment

Figure 11:
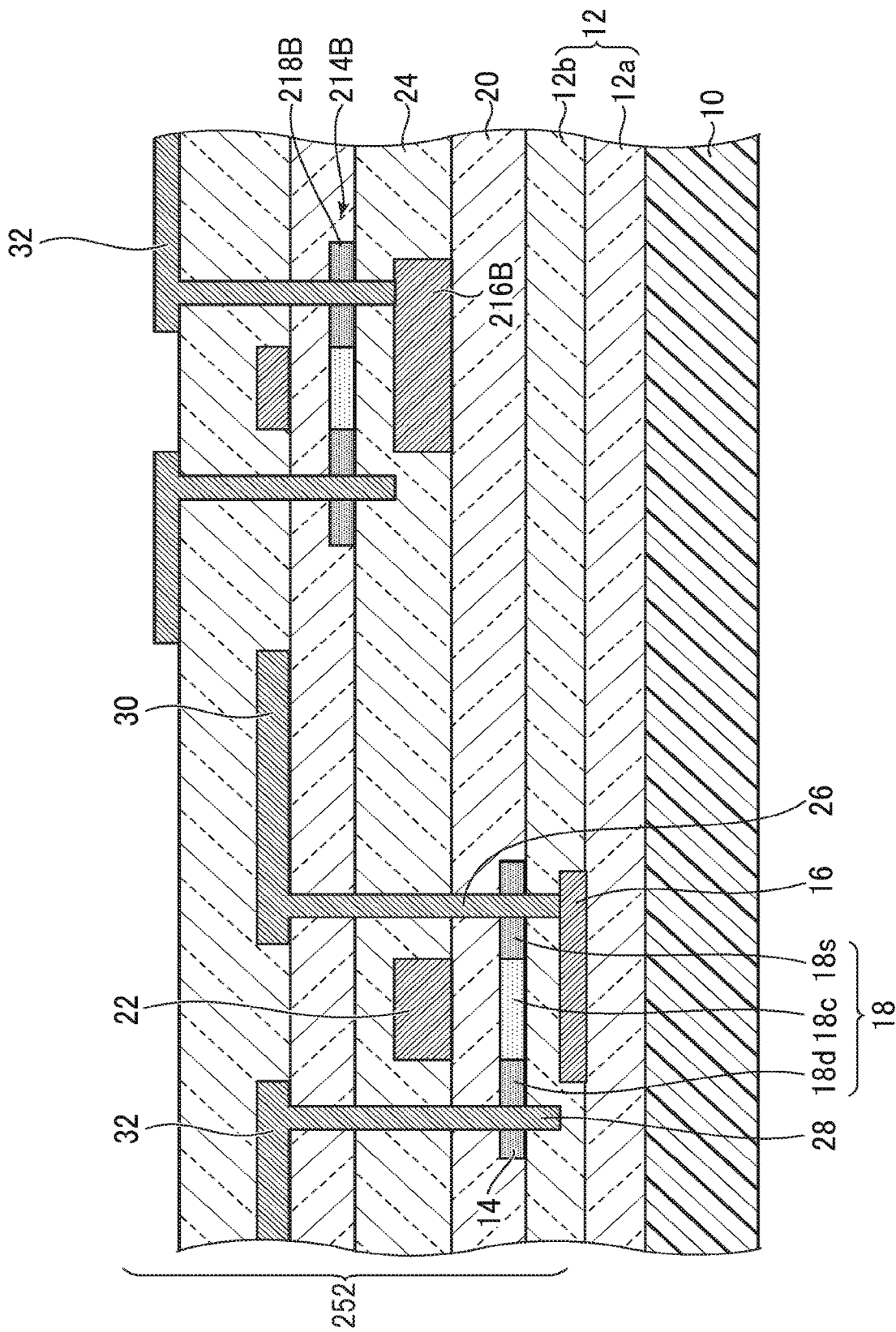
FIG. 11 is a cross-sectional view of a thin film transistor according to a second embodiment.

FIG. 11 is a cross-sectional view of a thin film transistor according to the second embodiment. A circuit layer 252 includes the thin film transistor 14 described in the first embodiment.

The circuit layer 252 further includes a second thin film transistor 214B. The second thin film transistor 214B includes a second semiconductor layer 218B. While the semiconductor layer 18 is made of polysilicon, the second semiconductor layer 218B is made of an oxide semiconductor. The second semiconductor layer 218B is farther away from the semiconductor layer 18 than the first gate electrode 22, above the semiconductor layer 18. The second thin film transistor 214B includes a second gate electrode 216B below the second semiconductor layer 218B. The second gate electrode 216B is in the same layer as the first gate electrode 22, and both the gate electrodes can be simultaneously made of the same material. Other contents of the second thin film transistor 214B correspond to the contents of the thin film transistor 14 except that a layer position is different. The other contents correspond to the contents described in the first embodiment.

Third Embodiment

Figure 12:
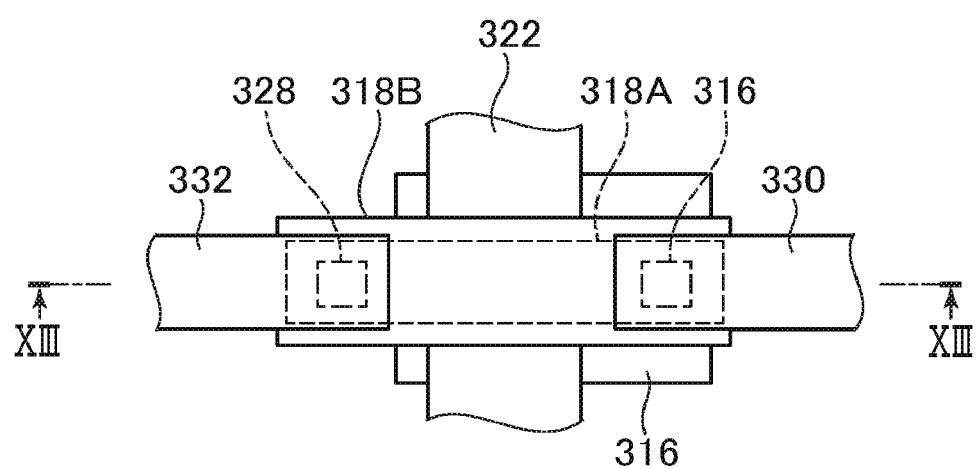
FIG. 12 is a plan view of a thin film transistor according to a third embodiment.
Figure 13:
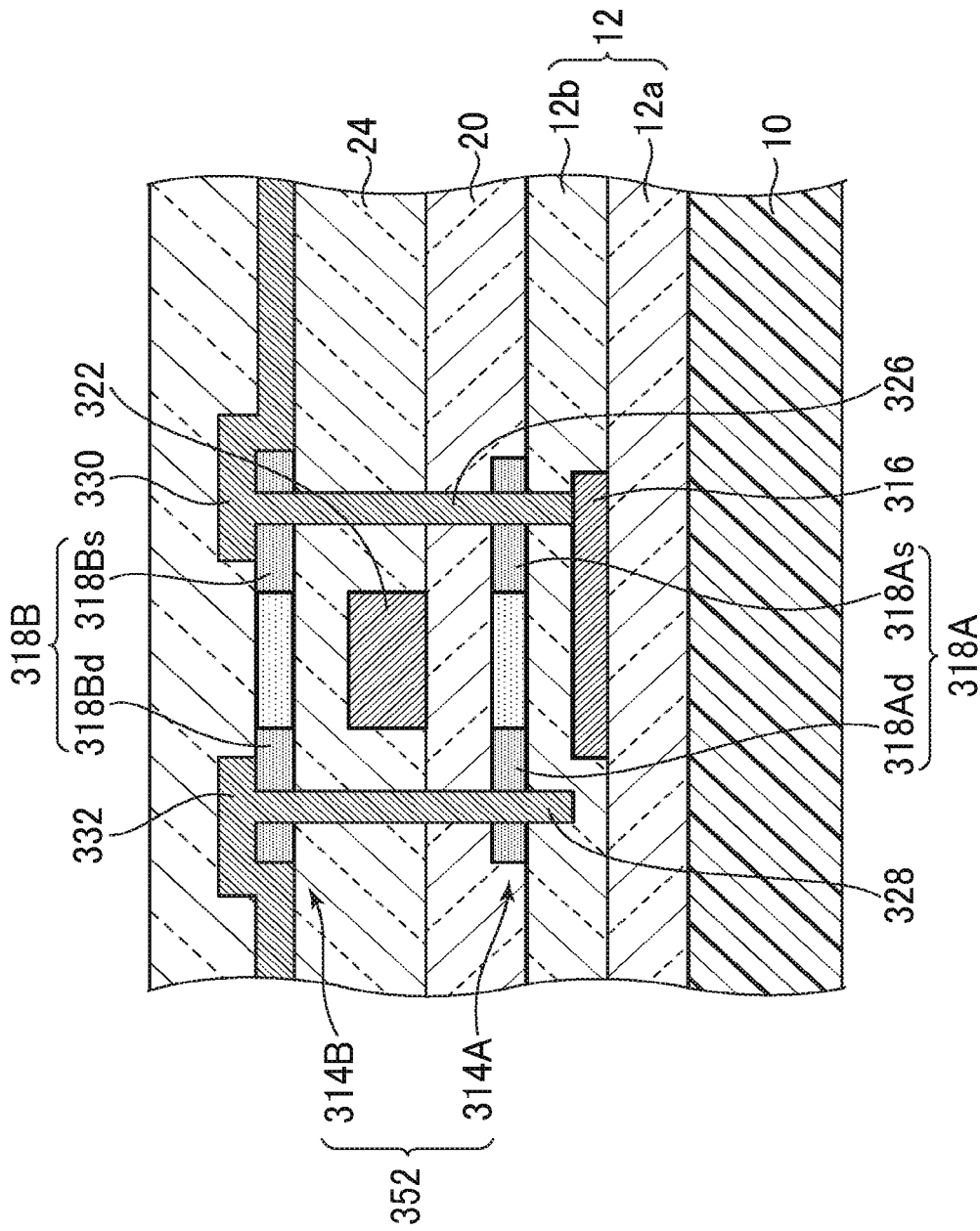
FIG. 13 is a cross-sectional view of the thin film transistor illustrated in FIG. 12, taken along line XIII-XIII.

FIG. 12 is a plan view of a thin film transistor according to the third embodiment. FIG. 13 is a cross-sectional view of the thin film transistor illustrated in FIG. 12, taken along line XIII-XIII.

A circuit layer 352 includes a first thin film transistor 314A and a second thin film transistor 314B. The contents of the thin film transistor 14 of the first embodiment correspond to the first thin film transistor 314A, and the second thin film transistor 314B is added to the contents of the thin film transistor 14. The first thin film transistor 314A and the second thin film transistor 314B share a first gate electrode 322, a source electrode 326, and a drain electrode 328.

The first thin film transistor 314A includes a first semiconductor layer 318A. The second thin film transistor 314B includes a second semiconductor layer 318B. While the first semiconductor layer 318A is made of polysilicon, the second semiconductor layer 318B is made of an oxide semiconductor. The second semiconductor layer 318B overlaps the first semiconductor layer 318A. The second semiconductor layer 318B is farther away from the first semiconductor layer 318A than the first gate electrode 322, above the first semiconductor layer 318A. That is, the first thin film transistor 314A is a top gate type transistor, and the second thin film transistor 314B is a bottom gate type transistor.

The source electrode 326 and the drain electrode 328 penetrate through the first semiconductor layer 318A (first source region 318As or first drain region 318Ad) and the second semiconductor layer 318B (second source region 318Bs or second drain region 318Bd). A source wiring 330 and a drain wiring 332 have portions that are in contact with and mounted on the second semiconductor layer 318B (second source region 318Bs or second drain region 318Bd).

Also in this embodiment, the source electrode 326 is connected to a second gate electrode 316 below the first semiconductor layer 318A and both gate electrodes are at the same potential. This electrical connection is made by the source electrode 326 penetrating through the first semiconductor layer 318A, and thus there is no need to secure a region for connection. The other contents correspond to the contents described in the first embodiment.

Fourth Embodiment

Figure 14:
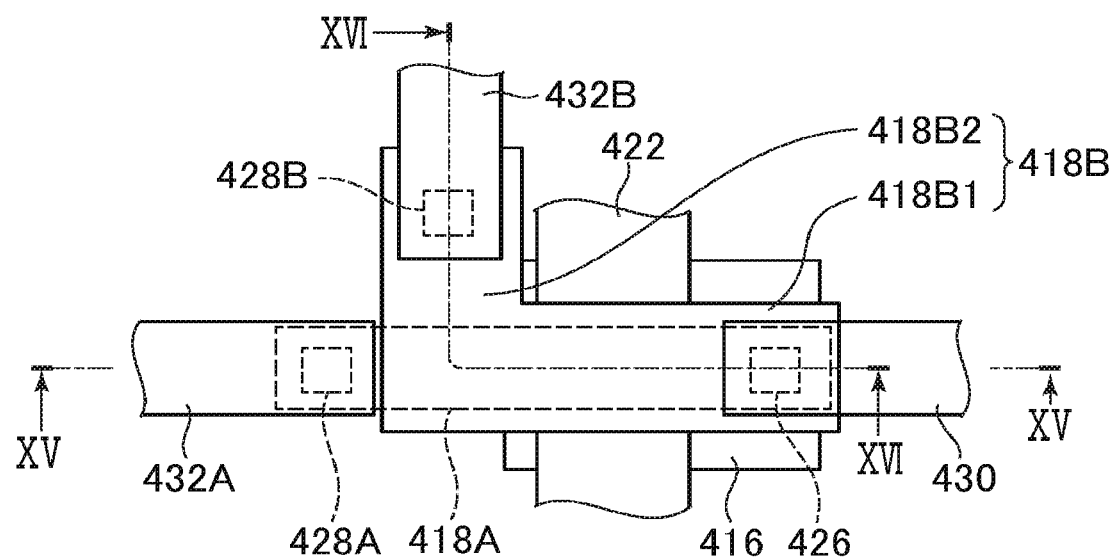
FIG. 14 is a plan view of a thin film transistor according to a fourth embodiment.
Figure 15:
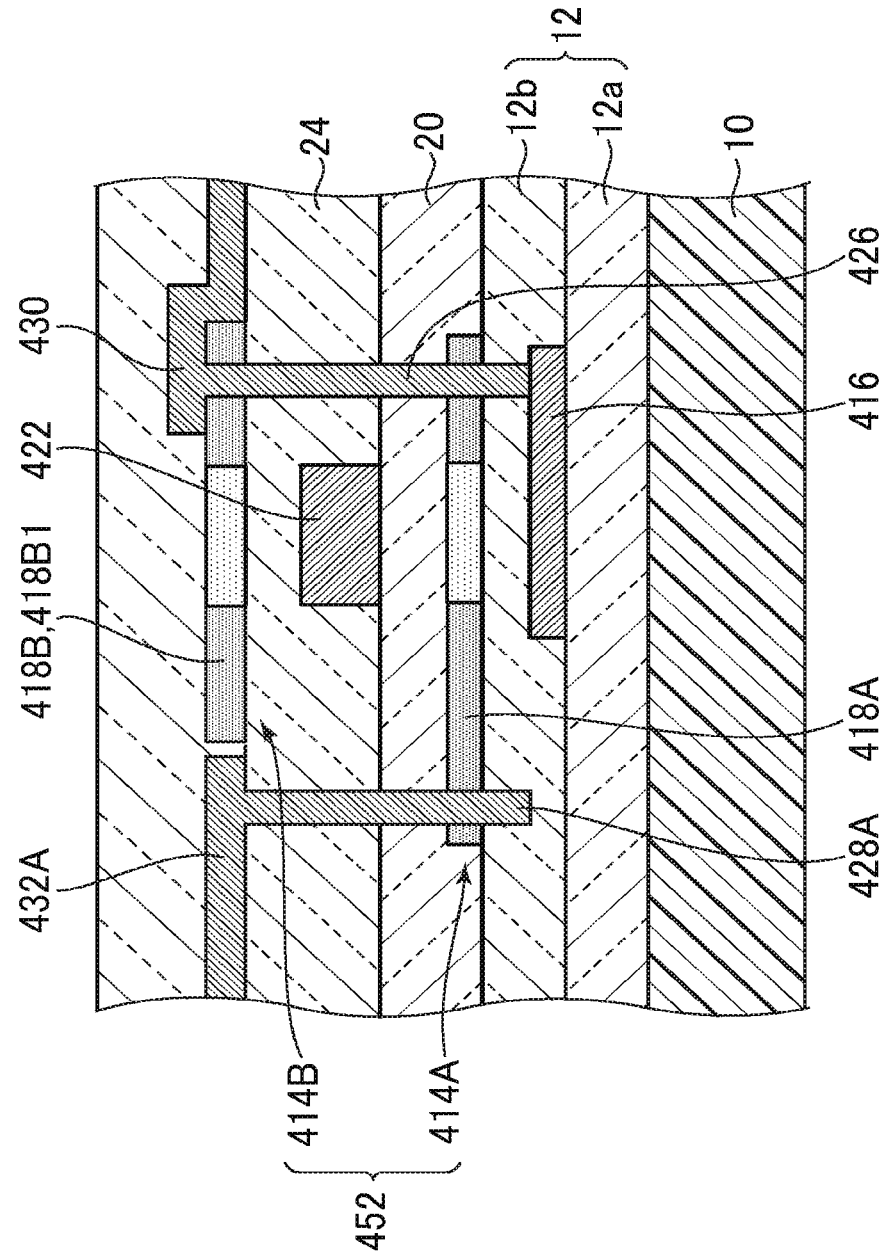
FIG. 15 is a cross-sectional view of the thin film transistor illustrated in FIG. 14, taken along line XV-XV.
Figure 16:
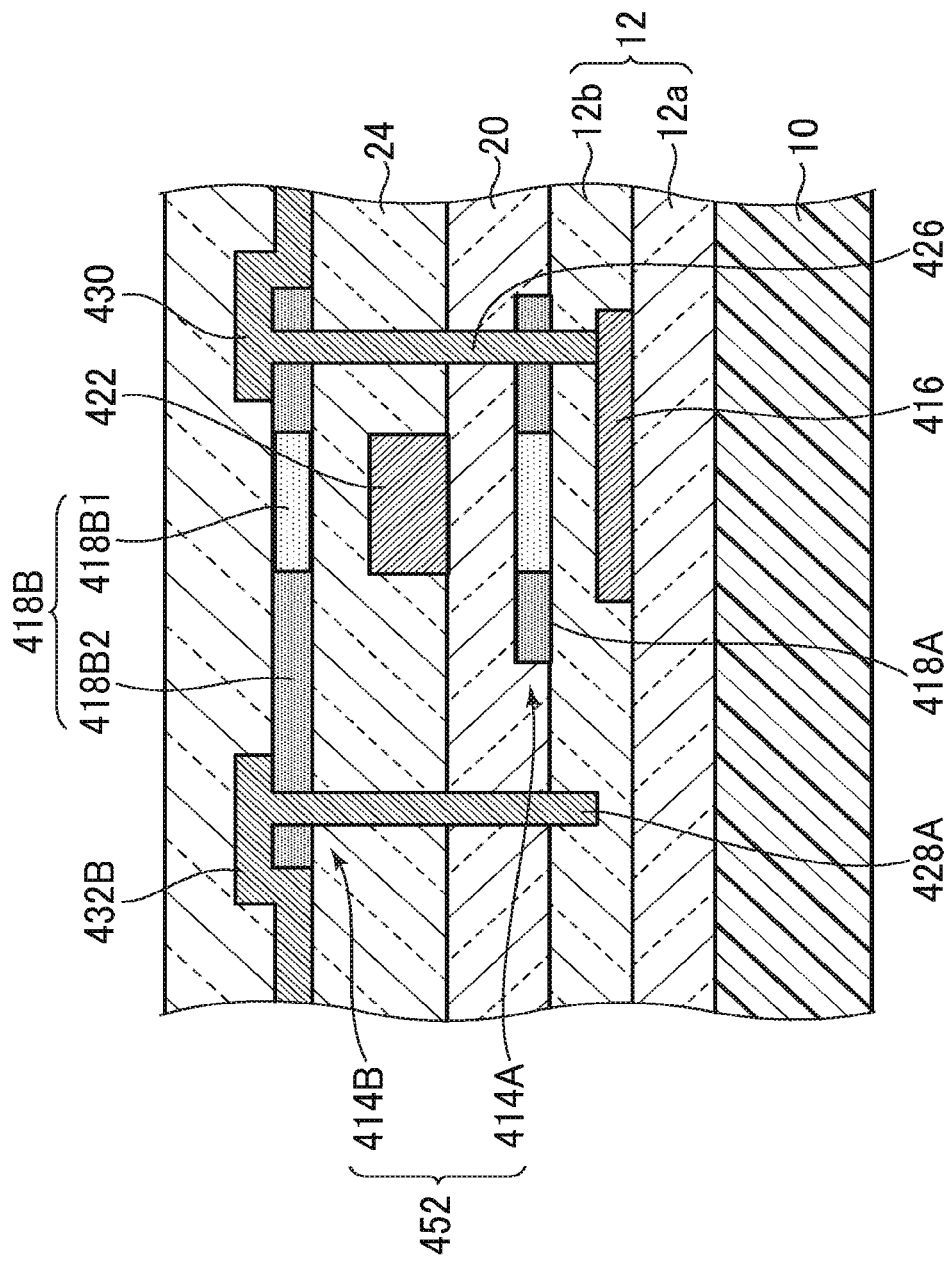
FIG. 16 is a cross-sectional view of the thin film transistor illustrated in FIG. 14, taken along line XVI-XVI.

FIG. 14 is a plan view of a thin film transistor according to a fourth embodiment. FIG. 15 is a cross-sectional view of the thin film transistor illustrated in FIG. 14 taken along line XV-XV. FIG. 16 is a cross-sectional view of the thin film transistor illustrated in FIG. 14 taken along line XVI-XVI.

A circuit layer 452 includes a first thin film transistor 414A and a second thin film transistor 414B. The contents of the thin film transistor 14 of the first embodiment correspond to the first thin film transistor 414A, and the second thin film transistor 414B is added to the contents of the thin film transistor 14. The first thin film transistor 414A and the second thin film transistor 414B share a first gate electrode 422 and a source electrode 426.

The first thin film transistor 414A includes a first semiconductor layer 418A. The second thin film transistor 414B includes a second semiconductor layer 418B. While the first semiconductor layer 418A is made of polysilicon, the second semiconductor layer 418B is made of an oxide semiconductor. The second semiconductor layer 418B overlaps the first semiconductor layer 418A. The second semiconductor layer 418B is farther apart from the first semiconductor layer 418A than the first gate electrode 422, above the first semiconductor layer 418A.

The second semiconductor layer 418B includes a first portion 418B1 extending in a first direction X from the source electrode 426 and a second portion 418B2 extending in a second direction Y intersecting the first direction X. The first portion 418B1 overlaps the first semiconductor layer 418A. The second portion 418B2 does not overlap the first semiconductor layer 418A. The source electrode 426 penetrates through the second semiconductor layer 418B (first portion 418B1) and both are electrically connected to each other. The source electrode 426 penetrates through the first semiconductor layer 418A and both are electrically connected to each other. The circuit layer 452 includes a source wiring 430 connected to the source electrode 426 above the first semiconductor layer 418A and the second semiconductor layer 418B. The source wiring 430 has a portion which is in contact with and mounted on the second semiconductor layer 418B.

The first thin film transistor 414A includes a first drain electrode 428A. The first drain electrode 428A penetrates through the first semiconductor layer 418A and both are made conductive. The circuit layer 452 includes a first drain wiring 432A connected to the first drain electrode 428A above the first semiconductor layer 418A and the second semiconductor layer 418B.

The second thin film transistor 414B includes a second drain electrode 428B. The second drain electrode 428B penetrates through the second portion 418B2 and both are electrically connected to each other. The second drain electrode 428B extends to the same depth as the first drain electrode 428A, but avoids contact with the first semiconductor layer 418A. The circuit layer 452 includes a second drain wiring 432B having a portion, which is in contact with and mounted on the second semiconductor layer 418B, in connection with the second drain electrode 428B, above the first semiconductor layer 418A and the second semiconductor layer 418B.

In this embodiment, the source electrode 426 is connected to a second gate electrode 416 below the first semiconductor layer 418A, and both electrodes are at the same potential. This electrical connection is made by the source electrode 426 penetrating through the first semiconductor layer 418A, and thus there is no need to secure a region for connection. The other contents correspond to the contents described in the first embodiment.

Fifth Embodiment

Figure 17:
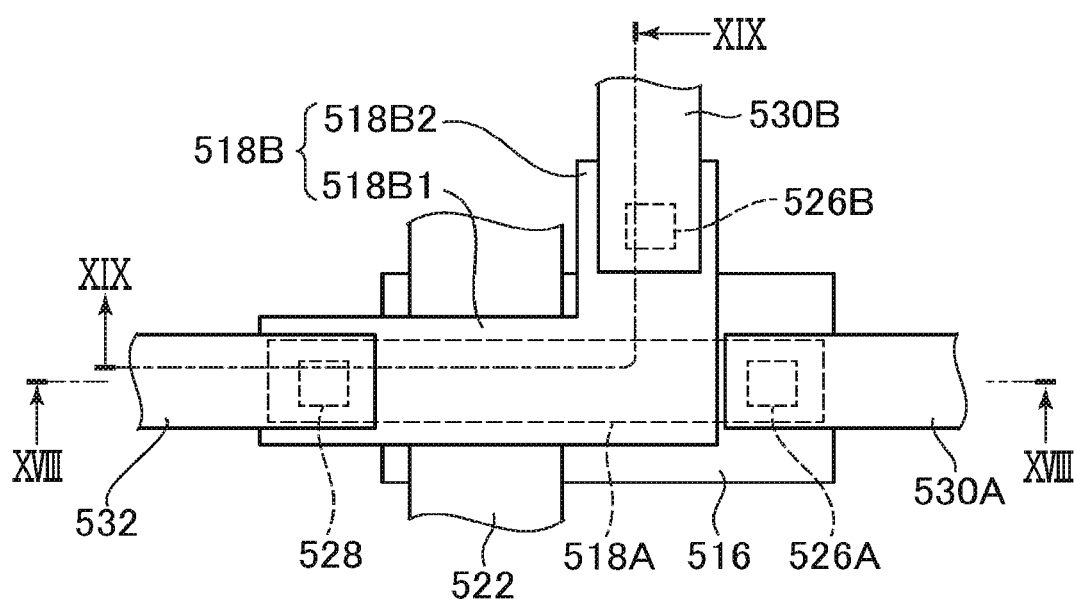
FIG. 17 is a plan view of a thin film transistor according to a fifth embodiment.
Figure 18:
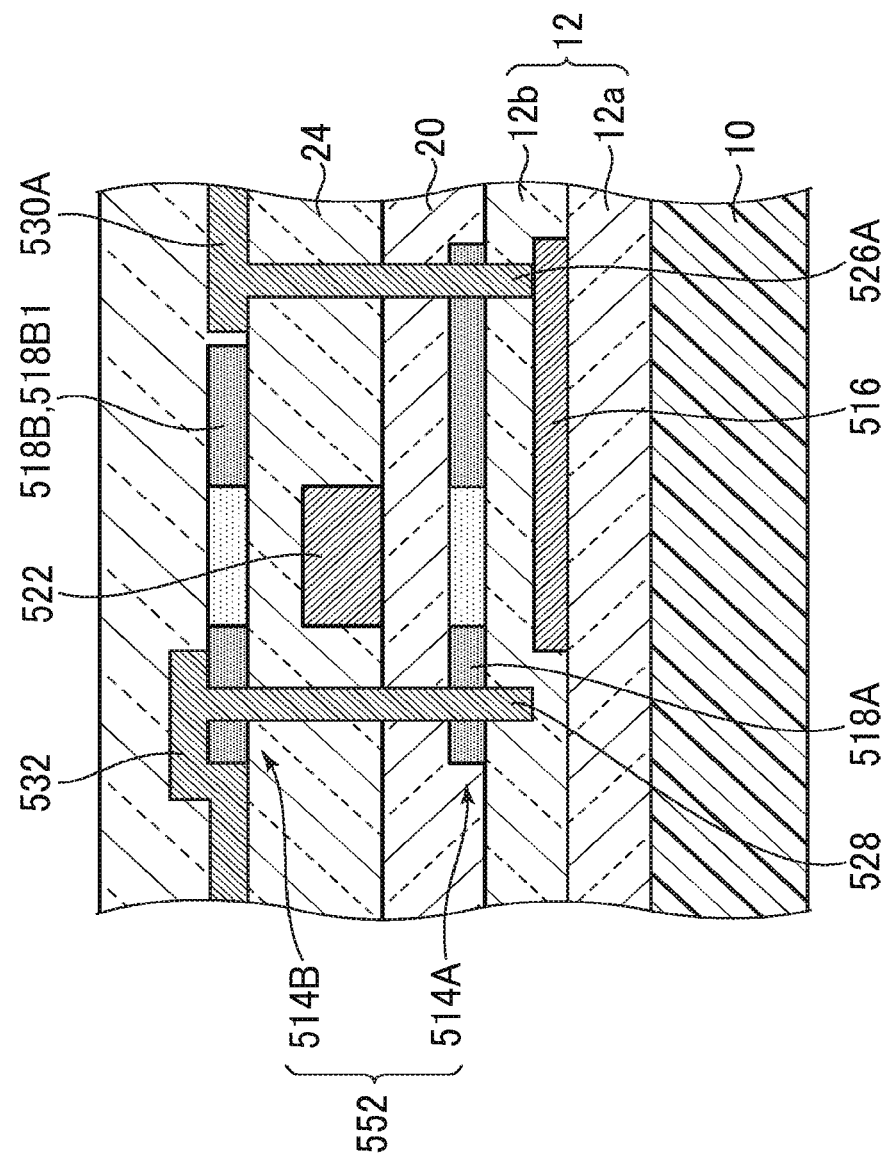
FIG. 18 is a cross-sectional view of the thin film transistor illustrated in FIG. 17, taken along line XVIII-XVIII.
Figure 19:
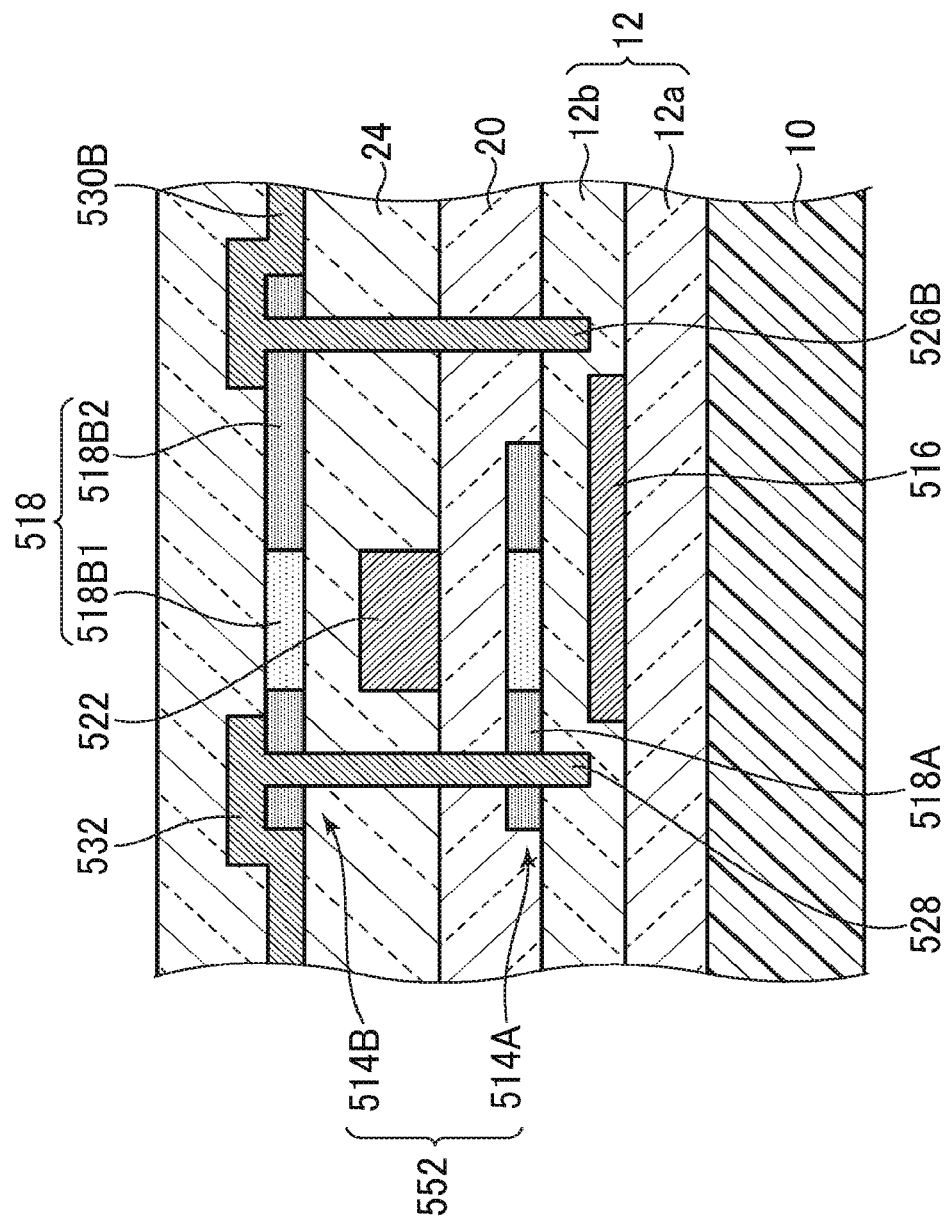
FIG. 19 is a cross-sectional view of the thin film transistor illustrated in FIG. 17, taken along line XIX-XIX.

FIG. 17 is a plan view of a thin film transistor according to a fifth embodiment. FIG. 18 is a cross-sectional view of the thin film transistor illustrated in FIG. 17, taken along line XVIII-XVIII. FIG. 19 is a cross-sectional view of the thin film transistor illustrated in FIG. 17, taken along line XIX-XIX.

A circuit layer 552 includes a first thin film transistor 514A and a second thin film transistor 514B. The contents of the thin film transistor 14 of the first embodiment correspond to the first thin film transistor 514A, and the second thin film transistor 514B is added to the contents of the thin film transistor 14. The first thin film transistor 514A and the second thin film transistor 514B share a first gate electrode 522 and a drain electrode 528.

The first thin film transistor 514A includes a first semiconductor layer 518A. The second thin film transistor 514B includes a second semiconductor layer 518B. While the first semiconductor layer 518A is made of polysilicon, the second semiconductor layer 518B is made of an oxide semiconductor. The second semiconductor layer 518B overlaps the first semiconductor layer 518A. The second semiconductor layer 518B is farther away from the first semiconductor layer 518A than the first gate electrode 522, above the first semiconductor layer 518A.

The second semiconductor layer 518B includes a first portion 518B1 extending in the first direction X from the drain electrode 528 and a second portion 518B2 extending in the second direction Y intersecting the first direction X. The first portion 518B1 overlaps the first semiconductor layer 518A. The second portion 518B2 does not overlap the first semiconductor layer 518A. The drain electrode 528 penetrates through the second semiconductor layer 518B (first portion 518B1) and both are electrically connected to each other. The drain electrode 528 penetrates through the first semiconductor layer 518A and both are electrically connected to each other. The circuit layer 552 includes a drain wiring 532 connected to the drain electrode 528 above the first semiconductor layer 518A and the second semiconductor layer 518B. The drain wiring 532 has a portion which is in contact with and mounted on the second semiconductor layer 518B.

The first thin film transistor 514A includes a first source electrode 526A. The first source electrode 526A penetrates through the first semiconductor layer 518A and both are electrically connected to each other. The circuit layer 552 includes a first source wiring 530A connected to the first source electrode 526A above the first semiconductor layer 518A.

The second thin film transistor 514B includes a second source electrode 526B. The second source electrode 526B penetrates through the second portion 518B2 and both are electrically connected to each other. The second source electrode 526B extends to the same depth as the first source electrode 526A, but avoids contact with the first semiconductor layer 518A. The circuit layer 552 includes a second source wiring 530B having a portion, which is in contact with and mounted on the second semiconductor layer 518B, in connection with the second source electrode 526B, above the first semiconductor layer 518A and the second semiconductor layer 518B.

Also in the present embodiment, the first source electrode 526A is connected to a second gate electrode 516 below the first semiconductor layer 518A and both the electrodes are at the same potential. This electrical connection is made by the first source electrode 526A penetrating through the first semiconductor layer 518A, and thus there is no need to secure a region for connection. The other contents correspond to the contents described in the first embodiment.

Sixth Embodiment

Figure 20:
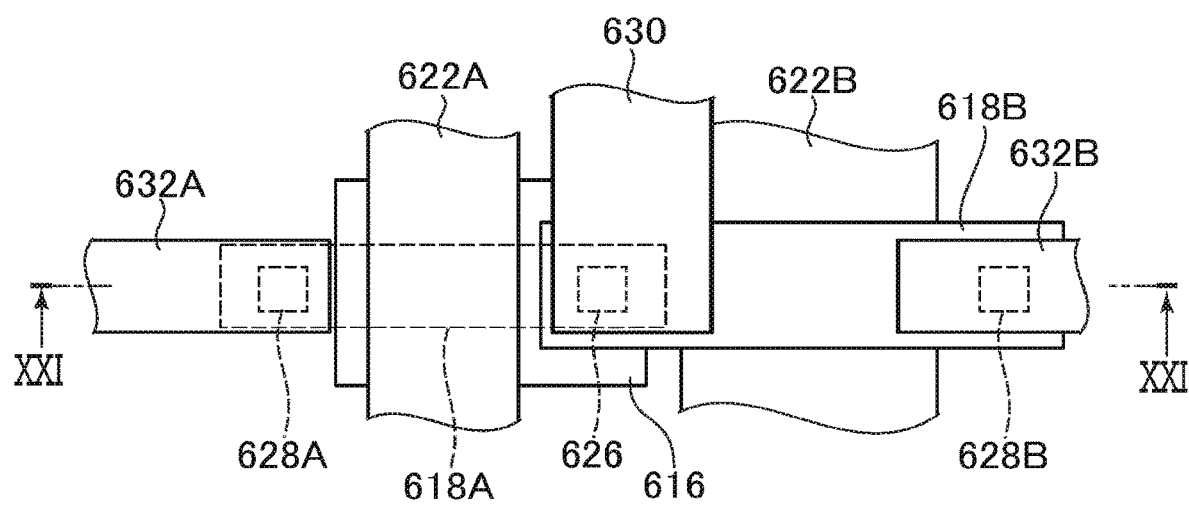
FIG. 20 is a plan view of a thin film transistor according to a sixth embodiment.
Figure 21:
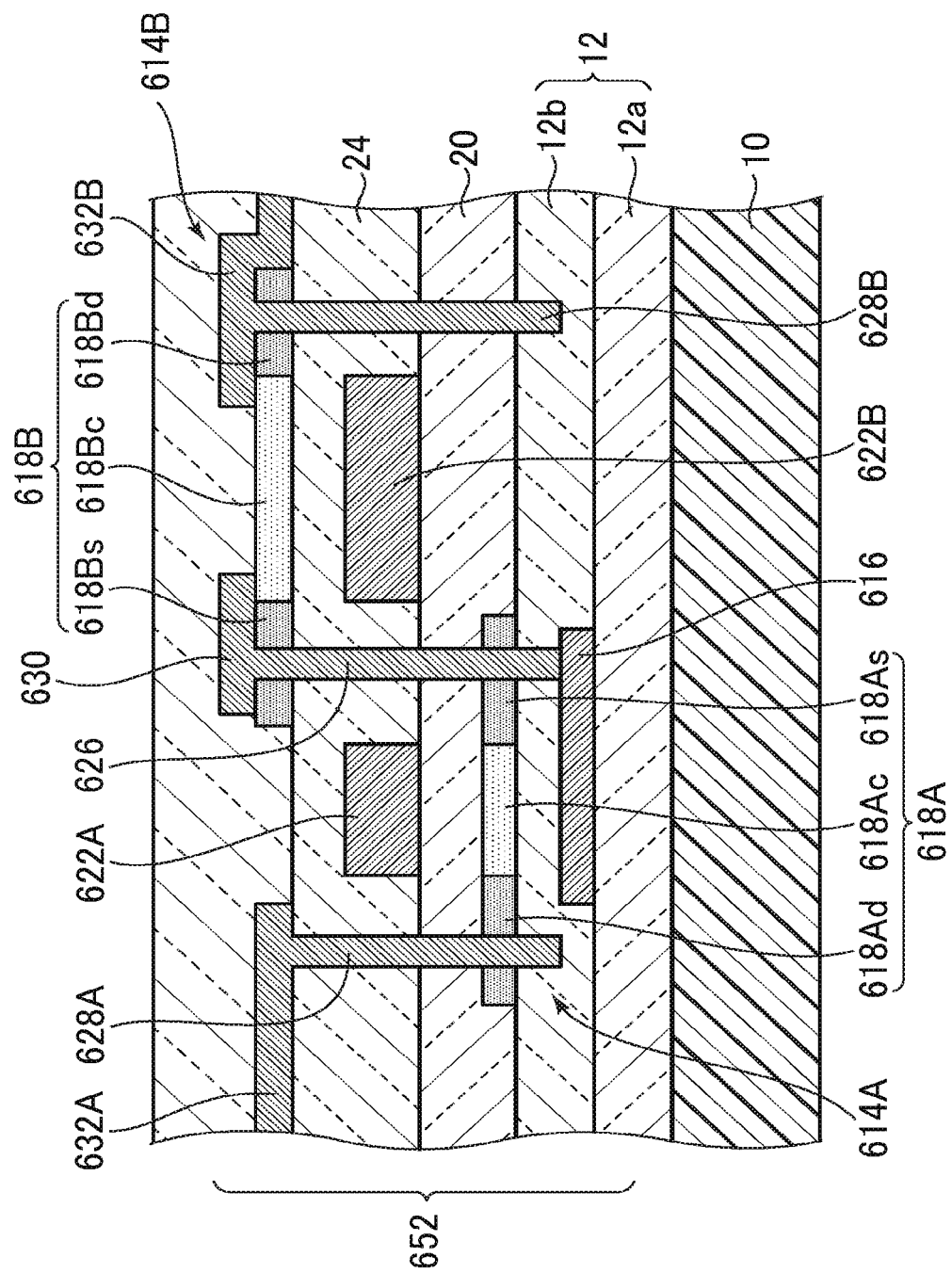
FIG. 21 is a cross-sectional view of the thin film transistor illustrated in FIG. 20, taken along line XXI-XXI.

FIG. 20 is a plan view of a thin film transistor according to a sixth embodiment. FIG. 21 is a cross-sectional view of the thin film transistor illustrated in FIG. 20, taken along line XXI-XXI.

A circuit layer 652 includes a first thin film transistor 614A and a second thin film transistor 614B. The contents of the thin film transistor 14 of the first embodiment correspond to the first thin film transistor 614A, and the second thin film transistor 614B is added to the contents of the thin film transistor 14. The first thin film transistor 614A and the second thin film transistor 614B share a source electrode 626.

The first thin film transistor 614A includes a first semiconductor layer 618A. The second thin film transistor 614B includes a second semiconductor layer 618B. While the first semiconductor layer 618A is made of polysilicon, the second semiconductor layer 618B is made of an oxide semiconductor. The second semiconductor layer 618B is farther apart from the first semiconductor layer 618A than a first gate electrode 622A, above the first semiconductor layer 618A. In the first semiconductor layer 618A and the second semiconductor layer 618B, a first source region 618As and a second source region 618Bs overlap, but a first drain region 618Ad and a second drain region 618Bd do not overlap, and a first channel region 618Ac and a second channel region 618Bc also do not overlap.

The source electrode 626 penetrates through the first semiconductor layer 618A (first source region 618As) and both are electrically connected to each other. The source electrode 626 penetrates through the second semiconductor layer 618B (second source region 618Bs) and both are electrically connected to each other. The circuit layer 652 includes a source wiring 630 connected to the source electrode 626 above the first semiconductor layer 618A and the second semiconductor layer 618B. The source wiring 630 has a portion which is in contact with and mounted on the second semiconductor layer 618B.

The first thin film transistor 614A includes a first drain electrode 628A. The circuit layer 652 includes a first drain wiring 632A connected to the first drain electrode 628A above the first semiconductor layer 618A and the second semiconductor layer 618B. The second thin film transistor 614B includes a second drain electrode 628B. The second drain electrode 628B extends to the same depth as the first drain electrode 628A, but avoids contact with the first semiconductor layer 618A. The circuit layer 652 includes a second drain wiring 632B connected to the second drain electrode 628B above the first semiconductor layer 618A and the second semiconductor layer 618B. The second drain wiring 632B has a portion which is in contact with and mounted on the second semiconductor layer 618B. The first thin film transistor 614A includes a first gate electrode 622A. The second thin film transistor 614B includes a third gate electrode 622B. The third gate electrode 622B is positioned in a layer where the first gate electrode 622A is located.

Also in this embodiment, the source electrode 626 is connected to a second gate electrode 616 below the first semiconductor layer 618A, and both the electrodes are at the same potential. This electrical connection is made by the source electrode 626 penetrating through the first semiconductor layer 618A, and thus there is no need to secure a region for connection. The other contents correspond to the contents described in the first embodiment.

Seventh Embodiment

Figure 22:
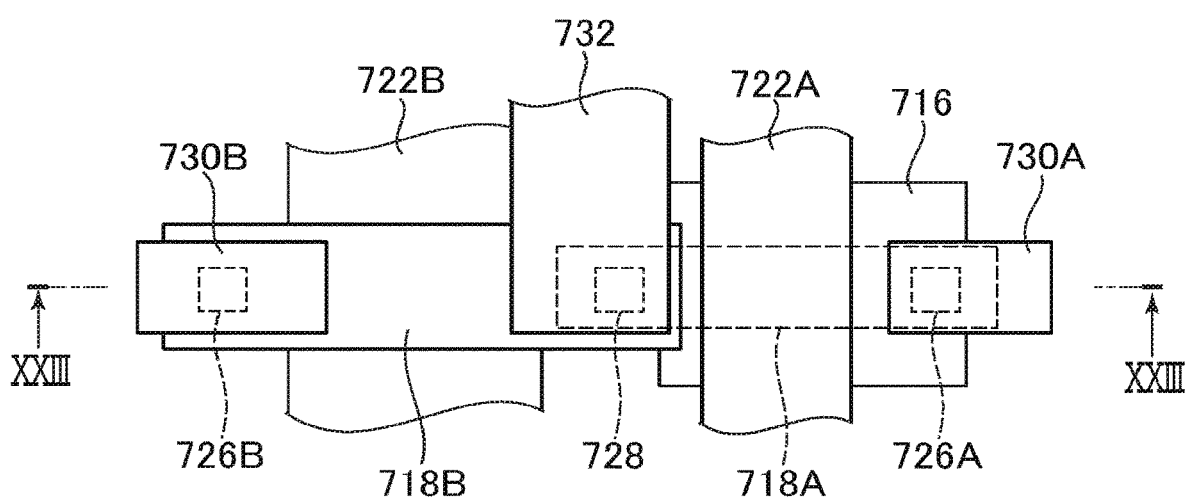
FIG. 22 is a plan view of a thin film transistor according to a seventh embodiment.
Figure 23:
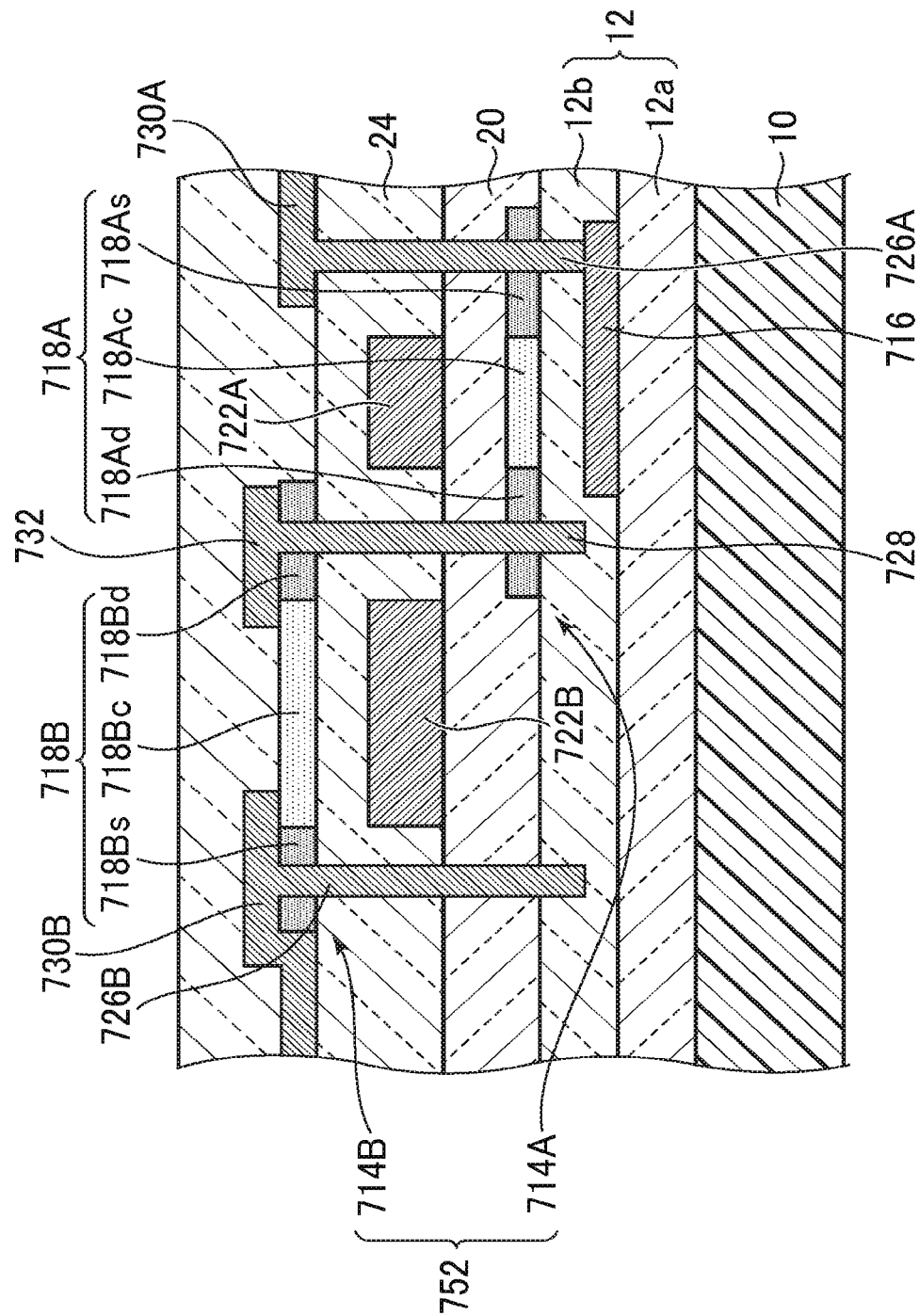
FIG. 23 is a cross-sectional view of the thin film transistor illustrated in FIG. 22, taken along line XXIII-XXIII.

FIG. 22 is a plan view of a thin film transistor according to a seventh embodiment. FIG. 23 is a cross-sectional view of the thin film transistor illustrated in FIG. 22, taken along line XXIII-XXIII.

A circuit layer 752 includes a first thin film transistor 714A and a second thin film transistor 714B. The contents of the thin film transistor 14 of the first embodiment correspond to the first thin film transistor 714A, and the second thin film transistor 714B is added to the contents of the thin film transistor 14. The first thin film transistor 714A and the second thin film transistor 714B share a drain electrode 728.

The first thin film transistor 714A includes a first semiconductor layer 718A. The second thin film transistor 714B includes a second semiconductor layer 718B. While the first semiconductor layer 718A is made of polysilicon, the second semiconductor layer 718B is made of an oxide semiconductor. The second semiconductor layer 718B is farther apart from the first semiconductor layer 718A than a first gate electrode 722A, above the first semiconductor layer 718A. Although a first drain region 718Ad and a second drain region 718Bd overlap, a first source region 718As and a second source region 718Bs do not overlap and a first channel region 718Ac and a second channel region 718Bc do not overlap.

The drain electrode 728 penetrates through the first semiconductor layer 718A (first drain region 718Ad) and both are electrically connected to each other. The drain electrode 728 penetrates through the second semiconductor layer 718B (second drain region 718Bd) and both are electrically connected to each other. The circuit layer 752 includes a drain wiring 732 connected to the drain electrode 728 above the first semiconductor layer 718A. The drain wiring 732 has a portion which is in contact with and mounted on the second semiconductor layer 718B.

The first thin film transistor 714A includes a first source electrode 726A. The circuit layer 752 includes a first source wiring 730A connected to the first source electrode 726A above the first semiconductor layer 718A and the second semiconductor layer 718B. The second thin film transistor 714B includes a second source electrode 726B. The second source electrode 726B extends to the same depth as the first source electrode 726A, but avoids contact with the first semiconductor layer 718A. The circuit layer 752 includes a second source wiring 730B connected to the second source electrode 726B above the first semiconductor layer 718A and the second semiconductor layer 718B. The second source wiring 730B has a portion which is in contact with and mounted on the second semiconductor layer 718B. The first thin film transistor 714A includes a first gate electrode 722A. The second thin film transistor 714B includes a third gate electrode 722B. The third gate electrode 722B is positioned on a layer where the first gate electrode 722A is located.

Also in this embodiment, the first source electrode 726A is connected to a second gate electrode 716 below the first semiconductor layer 718A, and both the electrodes are at the same potential. This electrical connection is made by the first source electrode 726A penetrating through the first semiconductor layer 718A, and thus there is no need to secure a region for connection. The other contents correspond to the contents described in the first embodiment.

The display device is not limited to the organic electroluminescence display device, and may be a display device provided with a light emitting element such as a quantum dot light emitting diode (QLED) in each pixel.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
a pixel layer for displaying an image; and
a circuit layer including a thin film transistor for driving the pixel layer, wherein
the thin film transistor includes
a semiconductor layer including a channel region and a source region and a drain region sandwiching the channel region,
a first gate electrode facing the channel region on a first side which is either on or below the semiconductor layer,
a second gate electrode facing at least the channel region and the source region on a second side opposite to the first side,
a source electrode connected to the source region, and
a drain electrode connected to the drain region, and
the source electrode penetrates through the semiconductor layer and is connected to the second gate electrode on the second side, wherein
the drain electrode penetrates through the semiconductor layer and extends to the second side without contacting the second gate electrode,
the second gate electrode has a central region overlapping with the first gate electrode each other, and has a first end below a side of the drain electrode and a second end below a side of the source electrode,
a distance from the central region to the second end is larger than a distance from the first gate electrode to the source electrode in a plan view,
the first end and the second end are equally spaced apart from the central region,
the second gate electrode faces the drain region and has a hole, and
the drain electrode extends inside the hole of the second gate electrode.

2. The display device according to claim 1, wherein a distance from the central region to the first end is smaller than a distance from the first gate electrode to the drain electrode in a plan view.

3. The display device according to claim 1, wherein the drain electrode is farther away from the first gate electrode than the source electrode in a plan view.

4. The display device according to claim 1, wherein the source electrode and the drain electrode are equally spaced from the first gate electrode.

5. The display device according to claim 1, wherein the thin film transistor is a first thin film transistor, the semiconductor layer is a first semiconductor layer, the circuit layer further includes a second thin film transistor, and
the second thin film transistor includes a second semiconductor layer farther away from the first semiconductor layer than the first gate electrode, on the first side.

6. The display device according to claim 5, wherein at least one of the source electrode and the drain electrode penetrates through the second semiconductor layer and is shared by the first thin film transistor and the second thin film transistor.

7. The display device according to claim 6, wherein the second thin film transistor shares one of the source electrode and the drain electrode with the first thin film transistor, and further includes one of a second source electrode and a second drain electrode.

8. The display device according to claim 7, wherein the second semiconductor layer has a first portion extending in a first direction from the one of the source electrode and the drain electrode, and a second portion extending in a second direction intersecting the first direction,
the one of the source electrode and the drain electrode penetrates through the first portion, and
the one of the second source electrode and the second drain electrode penetrates through the second portion.

9. The display device according to claim 7, wherein the circuit layer further includes a wiring having a portion, which is in contact with and mounted on the second semiconductor layer, in connection with one of the second source electrode and the second drain electrode, on the first side.

10. The display device according to claim 5, wherein the circuit layer further includes a source wiring connected to the source electrode and a drain wiring connected to the drain electrode, on the first side, and
at least one of the source wiring and the drain wiring has a portion which is in contact with and mounted on the second semiconductor layer.

11. The display device according to claim 5, wherein the second semiconductor layer overlaps the first semiconductor layer, and
the first thin film transistor and the second thin film transistor share the first gate electrode.

12. The display device according to claim 5, wherein the second thin film transistor includes a third gate electrode, and the third gate electrode and the first gate electrode are same layers.

13. The display device according to claim 5, wherein the second semiconductor layer is made of an oxide semiconductor.

\* \* \* \* \*